United States Patent [19]
Taylor et al.

[11] Patent Number: 5,825,630
[45] Date of Patent: Oct. 20, 1998

[54] ELECTRONIC CIRCUIT BOARD INCLUDING A SECOND CIRCUIT BOARD ATTACHED THERE TO TO PROVIDE AN AREA OF INCREASED CIRCUIT DENSITY

[75] Inventors: Billy K. Taylor, Columbia; Richard I. Mellitz, Irmo, both of S.C.

[73] Assignee: NCR Corporation, Dayton, Ohio

[21] Appl. No.: 744,964

[22] Filed: Nov. 7, 1996

[51] Int. Cl.$^6$ .............................. H05K 1/14; H05K 7/06; H01R 23/72

[52] U.S. Cl. .......................... 361/790; 174/258; 174/260; 361/785; 361/791; 361/803; 439/74; 439/75

[58] Field of Search ..................................... 174/258, 260, 174/261; 361/784, 785, 790, 744, 791, 803, 792–795; 395/282, 309, 500, 800, 311; 439/44, 45, 54, 69, 74, 75; 257/723, 724

[56] References Cited

U.S. PATENT DOCUMENTS

| | | | |
|---|---|---|---|
| 4,929,185 | 5/1990 | Wong et al. | 439/74 |
| 5,113,317 | 5/1992 | Howe . | |
| 5,130,768 | 7/1992 | Wu et al. . | |
| 5,132,879 | 7/1992 | Chang et al. . | |
| 5,220,491 | 6/1993 | Sugano et al. . | |
| 5,269,693 | 12/1993 | Sekine | 439/74 |
| 5,309,326 | 5/1994 | Minoru | 361/790 |
| 5,319,243 | 6/1994 | Leicht et al. | 257/723 |
| 5,384,692 | 1/1995 | Jaff | 361/785 |
| 5,390,078 | 2/1995 | Taylor | 361/790 |
| 5,394,300 | 2/1995 | Yoshimura | 361/737 |
| 5,460,531 | 10/1995 | Vivio | 439/70 |
| 5,610,801 | 3/1997 | Begis | 361/791 |
| 5,678,011 | 10/1997 | Kim et al. | 395/282 |

*Primary Examiner*—Donald Sparks
*Attorney, Agent, or Firm*—James M. Stover; Charlene Stukenborg

[57] ABSTRACT

A computer baseboard providing localized support for high pin count, high density components. The baseboard includes a first circuit board capable of supporting low pin count electrical components. The first circuit board has a surface onto which the low pin count electrical components are mounted, and an area to which a second, smaller, circuit board is connected in a parallel arrangement with the first circuit board. The second circuit board has a first surface onto which high pin count electrical components are mounted, and a second surface physically and electrically connected to the area on said first substrate. The first and second circuit boards together provide support for electrical components having higher pin counts and densities than the first circuit board can support individually, such as high performance microprocessors and chipsets. The first circuit board may be a low circuit density substrate while the second circuit board is a high circuit density substrate or multiple substrate layer board. Additionally, the second circuit board can be constructed of materials with better electrical characteristics, such as Cyanate Ester or other material having a low relative permeability, providing an advantage in meeting the tight timing characteristics of new, high performance microprocessors and chipsets.

8 Claims, 2 Drawing Sheets

ELECTRONIC CIRCUIT BOARD
INCLUDING A SECOND CIRCUIT BOARD
ATTACHED THERE TO TO PROVIDE AN
AREA OF INCREASED CIRCUIT DENSITY

The present invention relates to printed circuit board construction and, more particularly, to a method by which "localized" density can be obtained on a computer baseboard.

BACKGROUND OF THE INVENTION

Most present day personal computers (PCs) and servers include a printed circuit board (PCB), known as a baseboard or motherboard, to which is mounted a microprocessor and its associated chipsets, as well as many other integrated and discrete components, such as memory, disk controllers, basic input/output logic (BIOS), graphic controllers, parallel and serial communication port logic, etc. These baseboards typically also include sockets and connectors for receiving additional components, signal cables, component modules, and for connection to other printed circuit boards. The printed circuit board components and connectors are interconnected by address, data and control lines within the printed circuit board, as well as being connected to power and ground circuits. Often, the printed circuit board includes several signal layers to accommodate and isolate all the signal and power circuits required.

As new generations of microprocessors and support chips having greater integration densities and pin counts than ever before become available, and required in the high end desktop and server spaces in order to be competitive, the demands placed on the PCB also increase. In order to connect these high density, high pin count devices to one another, printed circuit boards having 10–12 interconnect layers and line widths and spaces less than 5 mils may be required.

Furthermore, as processor and other component clock speeds are increased, the signal path lengths between processor and supporting active elements becomes more critical. Shorter distances between processor and the active elements will improve total system throughput.

These requirements can dramatically increase the cost of PCBs. In the PCB fabrication industry, costs rise as interconnect densities increase. This relationship becomes exponential with regards to feature sizes, layer counts, etc., as the limits of mainstream technology are reached. In general, the cost of a PCB is determined by surface area, spacing and thickness of etch lines, layer count, and the materials used in the construction. In addition, it is generally not possible to "mix" technologies on a single PCB. In other words, if only a small area of the board requires expensive technology, the entire surface area of the board is subject to the costs associated with this dense area. An improved printed circuit board design providing high density construction where required for the support of high density, high pin count processors and support components at a low cost is desired.

OBJECTS OF THE INVENTION

It is therefore an object of the present invention to provide a new and useful computer baseboard providing high density construction where required for the support of high density, high pin count components.

It is another object of the present invention to provide such a computer baseboard which includes a smaller, high circuit density, circuit board mounted to the surface of the baseboard to provide localized support for high density, high pin count components.

It is yet another object of the present invention to provide such a computer baseboard which provides localized support for high density, high pin count components at a lower cost than a single board baseboard.

SUMMARY OF THE INVENTION

There is provided, in accordance with the present invention, a computer baseboard providing localized support for high pin count, high density components. The baseboard includes a first circuit board capable of supporting low pin count electrical components. The first circuit board has a surface onto which the low pin count electrical components are mounted, and an area to which a second, smaller, circuit board is connected in a parallel arrangement with the first circuit board. The second circuit board has a first surface onto which high pin count electrical components are mounted, and a second surface physically and electrically connected to the area on said first circuit board. The method of connecting the first board to the second board can be accomplished with any known attachment or connection technology, including soldered, welded, pin and socketed, glued, or pressure/contact activated vertical conduction material. The first and second circuit boards together provide support for electrical components having higher pin counts and densities or topologies than the first circuit board can support individually, such as high performance microprocessors and chipsets.

In the described embodiment, the first circuit board is a low circuit density substrate while the second circuit board is a high circuit density substrate or multiple substrate layer board. Additionally, the second circuit board can be constructed of materials with better electrical characteristics, such as Cyanate Ester or other material having a low relative permeability, providing an advantage in meeting the tight timing characteristics of new, high performance microprocessors and chipsets.

The above and other objects, features, and advantages of the present invention will become apparent from the following description and the attached drawings.

DETAILED DESCRIPTION OF THE PREFERRED EMBODIMENT

Those skilled in the art will recognize that the components and circuitry included on a computer baseboard will vary from system to system depending upon processing capabilities, system features and intended applications. With the foregoing in mind, the present invention provides a computer baseboard having mounted thereto an additional substrate so as to provide an area of higher circuit density for the support of high density, high pin count, components.

Figure 1:
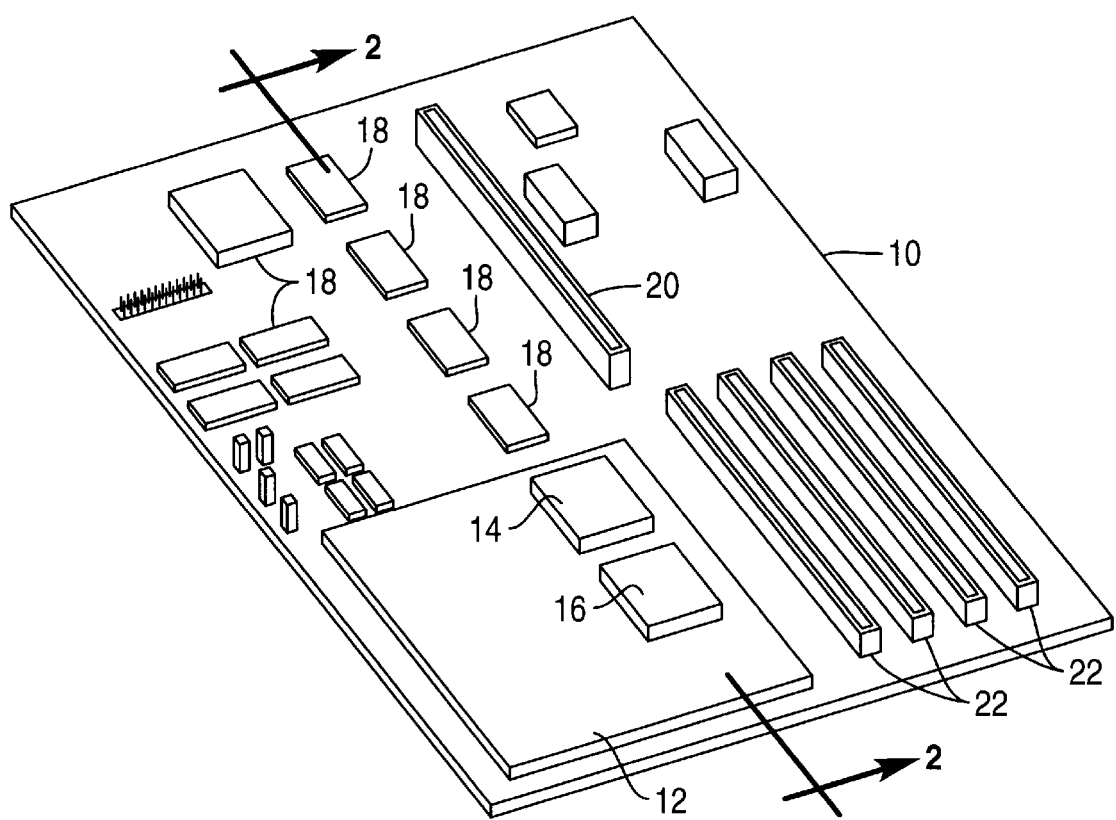
FIG. 1 is an isometric view of a printed circuit board including a higher density substrate built into or soldered onto the printed circuit board to provide support for high density, high pin count components in accordance with the present invention.
Figure 2:
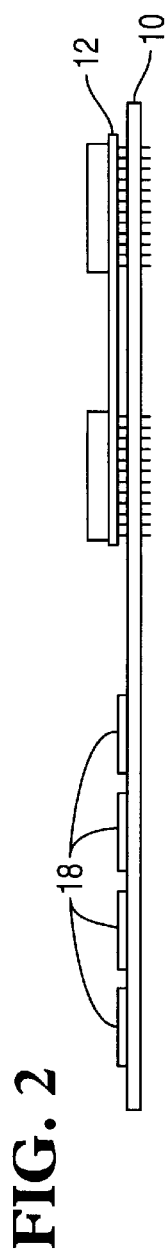
FIG. 2 is a sectional view of the printed circuit board shown in FIG. 1, illustrating one manner in which the high density substrate and components are connected to the printed circuit board.

Referring now to FIGS. 1 and 2, a first embodiment of the present invention will now be described. FIG. 1 provides an isometric view of a printed circuit board 10 including a higher density substrate 12 built into or soldered onto the printed circuit board to provide support for high density, high pin count components, such as a processor 14 and support chips 16. Additional components not requiring connection to a high density substrate are shown mounted directly to baseboard 10. These additional components include integrated circuit devices 18, board connector 20, SIMM memory sockets 22, as well as other common baseboard components.

FIG. 2 is a sectional view of the printed circuit board of FIG. 1 viewed along section line 2—2. The small, high density PCB (or substrate) 12 is treated as a component and soldered, or otherwise connected, into the much larger, less dense, baseboard 10. The connecting structure included on baseboard 10 for mating with the small, high density, substrate 12 could comprise solder balls, SMT, PGA sockets, bump connection, or any other known connecting means. The method of connecting substrate 12 to baseboard 10 can be accomplished with any known attachment or connection technology, including soldered, welded, pin and socketed, glued, or pressure/contact activated vertical conduction material.

FIGS. 1 and 2 illustrate a case where the high pin density components are of the through-hole variety, e.g., Pin Grid Arrays, and long pin "pin and cup" sockets are used to make the connections to the baseboard by soldering. The circuit density in the area between the high density components mounted to substrate 12 can be arbitrarily denser than that of the baseboard. Different pin placement topology can also be supported. In addition, the small substrate 12 can be constructed of materials with better electrical characteristics, such as Cyanate Ester or other material having a low relative permeability, providing an advantage in meeting the tight timing characteristics of new, high performance microprocessors and chipsets.

Since the cost of a printed circuit board is directly related to the size and density of the board, a cost savings can be achieved if the size of the high density substrate is much less than the size of the low density baseboard. In another implementation, the density of the each of the substrates could be reduced relative to that required by a single substrate, thus reducing the overall product cost.

Figure 3:
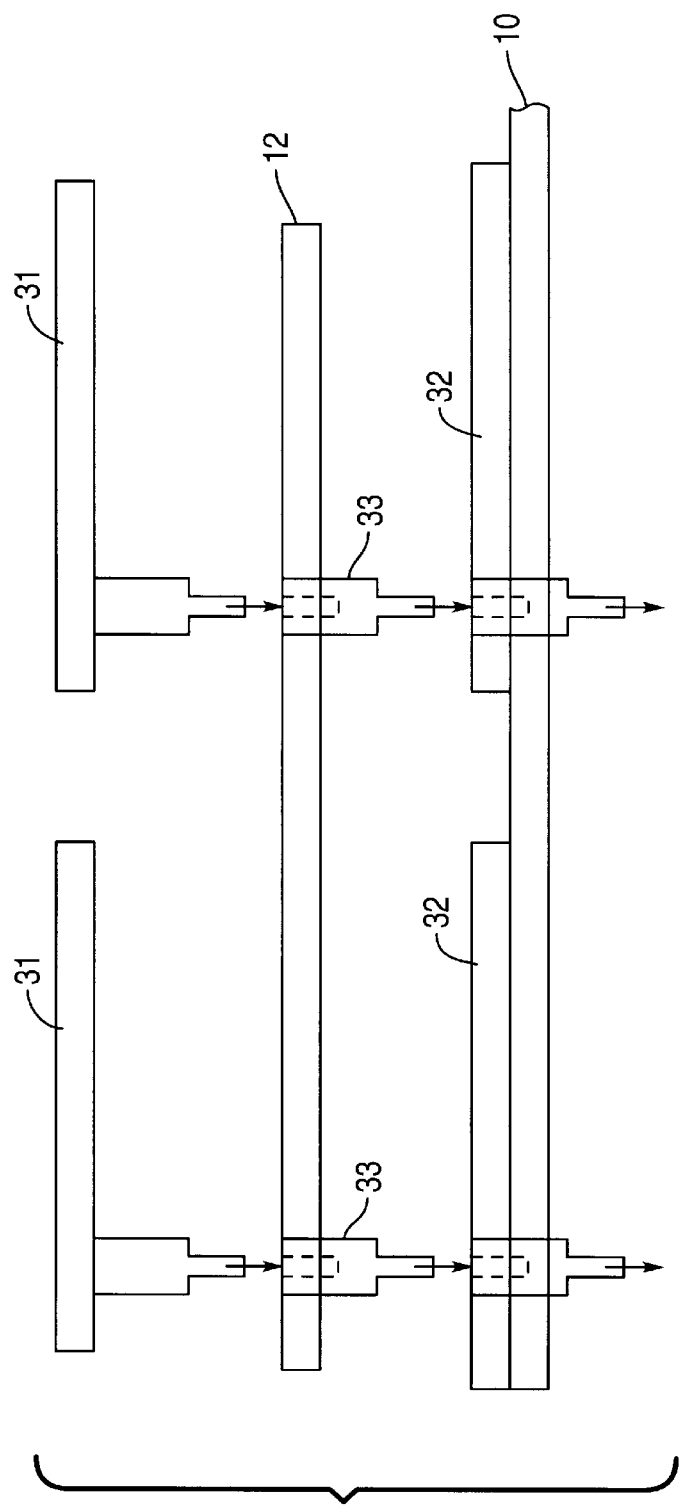
FIG. 3 is a sectional view of a small substrate interposed between two integrated circuit devices (IC) and corresponding IC sockets mounted on a larger printed circuit board in accordance with another embodiment of the present invention.

The small substrate 12 could also be sandwiched between an integrated circuit device (IC) 31 and its socket 32 as shown in FIG. 3. Thus the interposing smaller PCB 12 would be simply a low density/low layer count (whatever is needed) board and some pin/cup sockets 33.

This technique described above need not be exclusive to through-hole type devices. A high density substrate could be constructed with pads on the bottom that could be soldered to pads on the baseboard with conventional surface mount assembly methods, e.g. a screened on solder paste on both surfaces. In this case, a mechanical alignment mechanism would probably be required to ensure that the pads on the two PCBs line up with one another. Alternatively, a layer of anisotropic material (Z-axis conduction) or other pressure/contact activated vertical conduction material could be used to make connections between the two substrates.

Those skilled in the art will recognize that the preceding description of a preferred embodiment was merely for purposes of illustration and explanation. For example, the shape of the baseboard and high density substrate and layout of components and connecting structures can be varied from that shown in FIGS. 1 through 3. Those skilled in the art will also recognize that a variety of applications and modifications to the present invention would fall within the scope of the present invention. Accordingly, the present invention is to be limited only by the appended claims.

What is claimed is:

1. A computer baseboard, comprising:

a first circuit board having a surface onto which electrical components are mounted, and an area to which a second circuit board is connected in a parallel arrangement with said first circuit board;

said second circuit board having a first surface onto which electrical components are mounted, and a second surface physically and electrically connected to said area on said first circuit board;

said second circuit board being constructed of materials with better electrical characteristics than the materials used in the construction of said first circuit board and wherein said second circuit board has more substrate layers than said first circuit board;

whereby said second circuit board and said connected area on said first circuit board together provide support for electrical components having higher pin counts and densities than said first circuit board individually.

2. The computer baseboard in accordance with claim 1, wherein:

the second circuit board has a size smaller than the size of said first circuit board.

3. The computer baseboard in accordance with claim 1, wherein:

said first circuit board includes electrical circuitry having a first circuit density, and said second circuit board includes electrical circuitry having a second circuit density, said second circuit density being greater than said first circuit density.

4. A computer baseboard, comprising:

a first circuit board having a surface onto which electrical components are mounted, and an area to which a second circuit board is connected in a parallel arrangement with said first circuit board, said first circuit board comprising a multi-layer substrate; and said second circuit board having a first surface onto which electrical components are mounted, and a second surface physically and electrically connected to said area on said first circuit board, said second circuit board comprising a multi-layer substrate, said second substrate having more substrate layers than said first circuit board;

whereby said second circuit board and said connected area on said first circuit board together provide support for electrical components having higher pin counts and densities than said first circuit board individually.

5. The computer baseboard in accordance with claim 4, wherein:

the second circuit board has a size smaller than the size of said first circuit board.

6. The computer baseboard in accordance with claim 4, wherein:

said area on said first circuit board contains electrical sockets corresponding to the electrical components mounted to the first surface of said second circuit board; and the electrical components mounted to the first surface of said second circuit board have pins which extend through said second circuit board to engage with said corresponding electrical sockets.

7. A computer baseboard comprising:

a first circuit board having a surface onto which electrical components are mounted, and an area to which a second circuit board is connected in a parallel arrangement with said first circuit board;

said second circuit board having a first surface onto which electrical components are mounted, and a second surface physically and electrically connected to said area on said first circuit board;

said second circuit board being constructed of materials with better electrical characteristics than the materials used in the construction of said first circuit board;

whereby said second circuit board and said connected area on said first circuit board together provide support for electrical components having higher pin counts and densities than said first circuit board individually and wherein said second circuit board is constructed of Cyanate Ester.

8. A computer baseboard comprising:

a first circuit board having a surface onto which electrical components are mounted, and an area to which a second circuit board is connected in a parallel arrangement with said first circuit board;

said second circuit board having a first surface onto which electrical components are mounted, and a second surface physically and electrically connected to said area on said first circuit board;

said second circuit board being constructed of materials with better electrical characteristics than the materials used in the construction of said first circuit board;

whereby said second circuit board and said connected area on said first circuit board together provide support for electrical components having higher pin counts and densities than said first circuit board individually and wherein said area on said first circuit board contains electrical sockets corresponding to the electrical components mounted to the first surface of said second circuit board; and the electrical components mounted to the first surface of said second circuit board have pins which extend through said second circuit board to engage with said corresponding electrical sockets.

* * * * *